United States Patent [19]

Jun

[11] Patent Number: 5,219,780
[45] Date of Patent: Jun. 15, 1993

[54] METHOD FOR FABRICATING A SEMICONDUCTOR MEMORY CELL

[75] Inventor: Young K. Jun, Seoul, Rep. of Korea

[73] Assignee: Gold Star Electron Co., Ltd., Rep. of Korea

[21] Appl. No.: 849,916

[22] Filed: Mar. 12, 1992

[30] Foreign Application Priority Data

Mar. 14, 1991 [KR] Rep. of Korea ............... 4050/1991
Apr. 13, 1991 [KR] Rep. of Korea ............... 5961/1991

[51] Int. Cl.$^5$ .......................................... H01L 21/70
[52] U.S. Cl. .......................... 437/52; 437/47;
  437/48; 437/60; 437/233; 437/235; 437/919
[58] Field of Search .................. 437/47, 48, 52, 60,
  437/228, 233, 235, 919; 357/23.6; 365/149

[56] References Cited

U.S. PATENT DOCUMENTS 4,742,018 5/1988 Kimura et al. .................. 437/48

*Primary Examiner*—Tom Thomas

[57] ABSTRACT

The present invention relates to a method for fabricating a semiconductor memory cell consisting of a switching transistor and a capacitor wherein a polysilicon pad and a polysilicon storage node are simultaneously patterned with a self-alignment method without a mask.

Accordingly, the present invention has the following advantages: First, the overlay accuracy can be improved by patterning a polysilicon pad and a polysilicon storage node with a self-alignment method. Second, the fabrication process can be simpler than the prior fabrication process for the semiconductor memory cell of a noble stacked capacitor cell structure. Third, the storage capacitance of a capacitor can be increased.

4 Claims, 7 Drawing Sheets

F I G. 2A
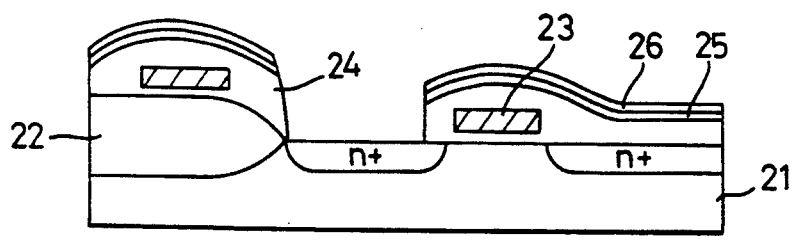
F I G. 2B
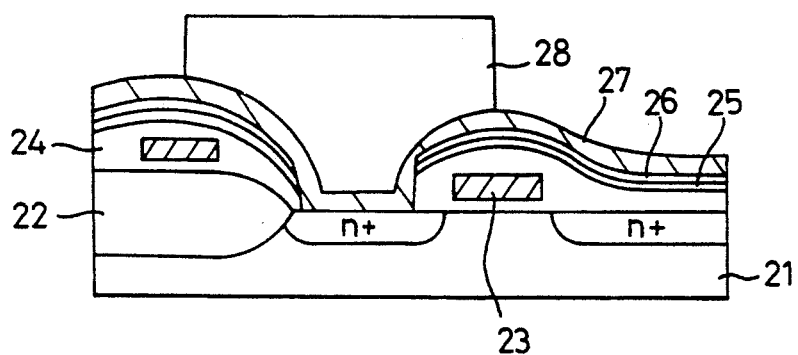
F I G. 2C
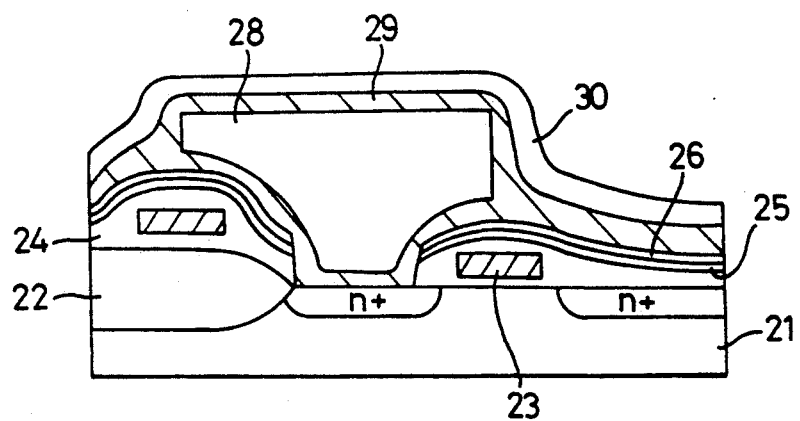

METHOD FOR FABRICATING A SEMICONDUCTOR MEMORY CELL

BACKGROUND OF THE INVENTION

The present invention relates to a method for fabricating a semiconductor memory cell and particularly to a method to improve the overlay accuracy and to increase the storage capacitance of a capacitor by simultaneously etching a polysilicon pad and a polysilicon storage node using a self-alignment method.

FIGS. 1(A) through 1(F) show schematic views of a fabrication process for a semiconductor memory cell of a noble stacked capacitor structure according to the prior art.

The conventional process used in fabricating a semiconductor memory cell of a noble stacked capacitor structure is described below with reference to the several views of FIG. 1:

As shown in FIG. 1(A), a gate 2 is formed on a substrate 1 and a CVD silicon oxide layer 3 is deposited using a chemical vapor deposition process over the whole surface and is then etched to form a buried contact. Subsequently, a silicon nitride layer 4 for a mask is deposited and patterned.

Thereafter, as shown in FIG. 1(B), a polysilicon layer is deposited on the whole surface and patterned to form polysilicon pad 5. As shown in FIG. 1(C), a silicon oxide layer 6 is deposited by using a CVD method and is patterned and then a polysilicon layer 7 is formed on the whole surface by using a CVD method.

Next, as shown in FIG. 1(D), said polysilicon layer 7 is etched by using an anisotropic dry etching method to the deposition depth thereof and the silicon oxide layer 6 is removed to pattern a polysilicon storage node.

As shown in FIG. 1(E), a dielectric film 8 is formed and a polysilicon layer is deposited again and patterned to form the polysilicon plate 9. Therefore, the capacitor of a memory cell consisting of a polysilicon storage node, a dielectric film and a cell plate is fabricated. Finally, as shown in FIG. 1(F), an insulated layer 10 of Boron Phosphosilicate Glass (BPSG) is deposited, and etched to form contact and a tungsten plug 11 is next coated to form the bit line.

However, in the conventional technique used in fabricating a semiconductor memory cell of a noble stacked capacitor cell structure, the overlay accuracy is often inferior due to misalignment because of the need to etch both a polysilicon pad and a polysilicon storage node, and because the masking must also be accomplished in the fabrication process.

SUMMARY OF THE INVENTION

It is an object of the present invention to simplify the method of fabricating a semiconductor memory cell, to improve the overlay accuracy, and to increase the storage capacitance of a capacitor by simultaneously patterning a polysilicon pad and a polysilicon storage node without using a mask.

In order to achieve the above object of the present invention, there is provided a method for fabricating a semiconductor memory cell consisting of a switching transistor and a capacitor wherein a polysilicon pad and a polysilicon storage node are simultaneously patterned by using a self-alignment method without using a mask.

The above and other related objects and features of the present invention will be apparent from a reading of the following description of the disclosure found in the accompanying drawings, and the novelty thereof is pointed out in the claims.

BRIEF DESCRIPTION OF THE DRAWINGS

FIGS. 2(A) through 2(G) are schematic views of a fabrication process for a semiconductor memory cell according to a first embodiment of the present invention.

DETAILED DESCRIPTION OF THE INVENTION

Figure 1A:
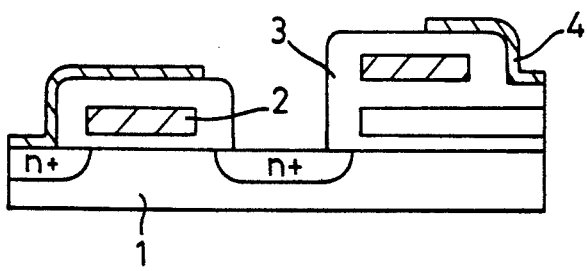
FIGS. 1(A) through 1(F) are schematic views of the fabrication process for a semiconductor memory cell of a noble stacked capacitor cell structure according to the prior art.
Figure 1B:
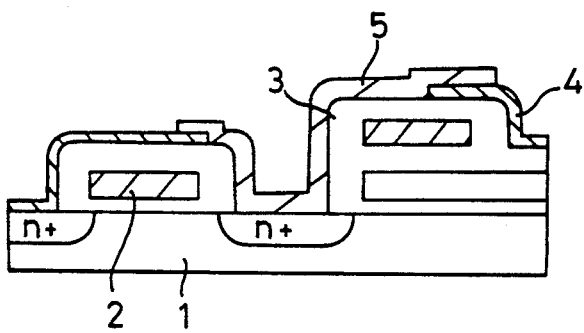
Figure 1C:
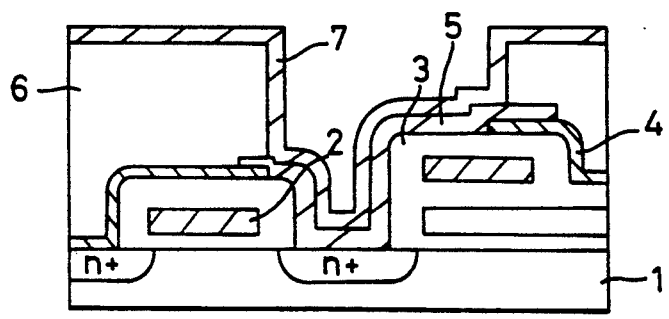
Figure 1D:
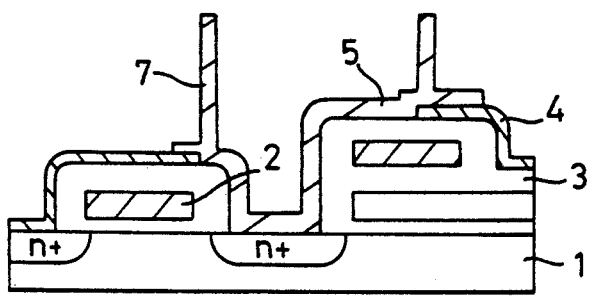
Figure 1E:
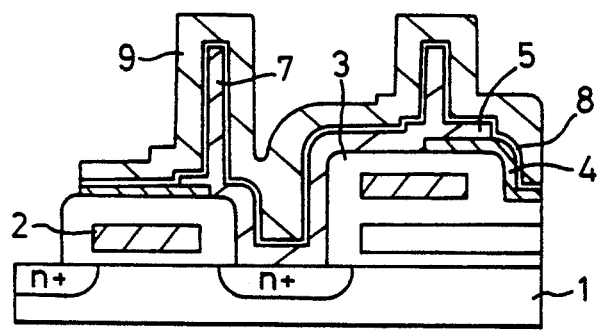
Figure 1F:
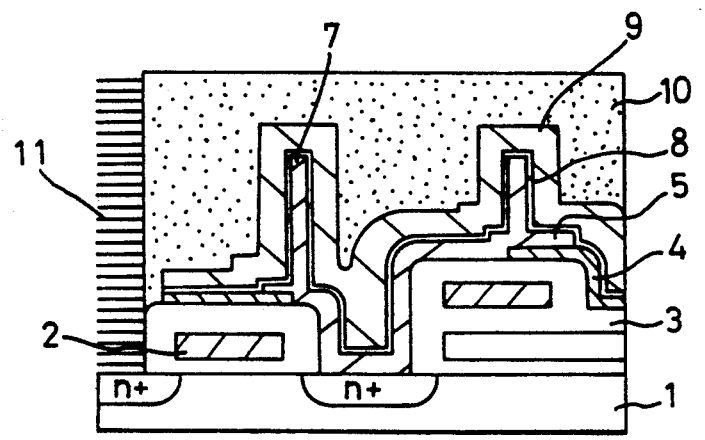

A process for fabricating a semiconductor memory cell of the present invention will be described in more detail with reference to FIG. 2 and FIG. 3 hereinafter.

FIG. 2 shows schematic views of the fabrication process for a semiconductor memory cell according to the first embodiment of the present invention.

As shown in FIG. 2(A), a field oxide layer 22 and a gate 23 are formed on a substrate 21. The CVD silicon oxide layer 24 and successive deposition layers of a silicon nitride pad 25 and a silicon oxide pad layer 26 are formed on the whole surface, and are etched using a photomasking process to form a buried contact.

Then, as shown in FIG. 2(B), a first polysilicon layer 27 is deposited on the whole surface and an insulated layer 28 for leveling a surface is deposited and then patterned. As shown in FIG. 2(C), a second polysilicon layer 29 and a silicon oxide layer 30 are deposited in order on the whole surface.

Figure 2D:
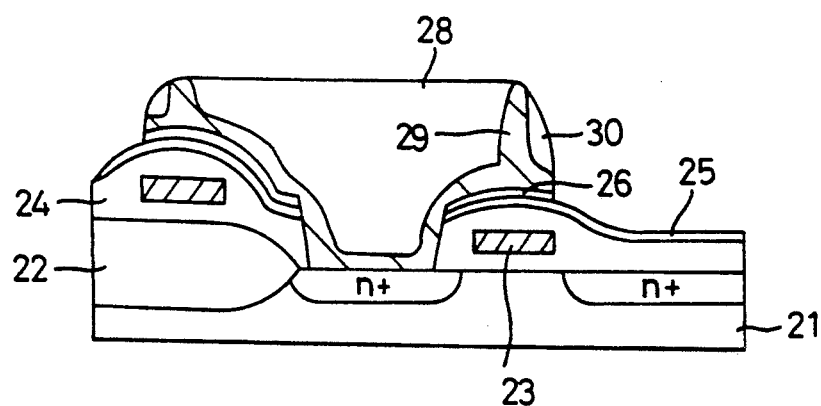

As shown in FIG. 2(D), the silicon oxide layer 30 is etched back by using an anisotropic dry etching method over the deposition depth thereof. Then, the exposed second polysilicon layer 29 is etched back over the deposition depth thereof to pattern simultaneously a polysilicon pad and a polysilicon storage node without using a mask.

Herein the silicon nitride layer 25 is used for an etching stopper.

Figure 2E:
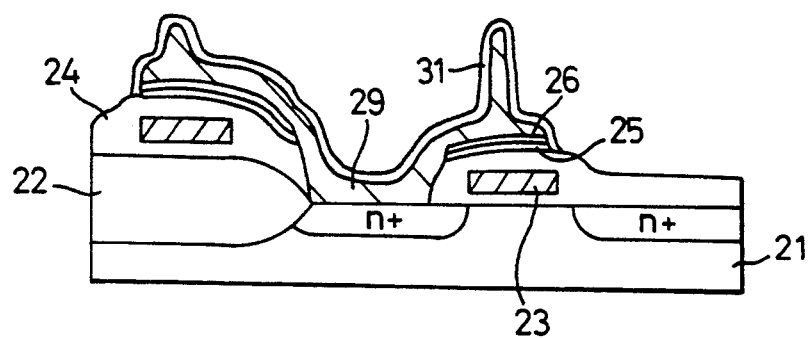

As shown in FIG. 2(E), the silicon oxide layer 30 of a side wall and the insulated layer 28 for leveling a surface are removed by using a wet-etching method. Then, the silicon nitride pad layer 25 is removed by using the wet-etching method and dielectric film 31 is formed.

Figure 2F:
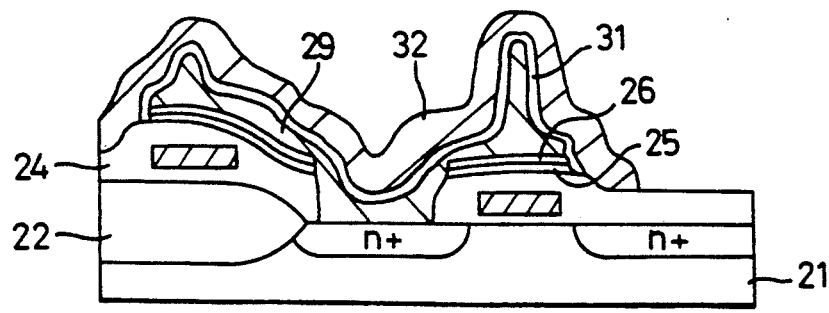
Figure 2G:
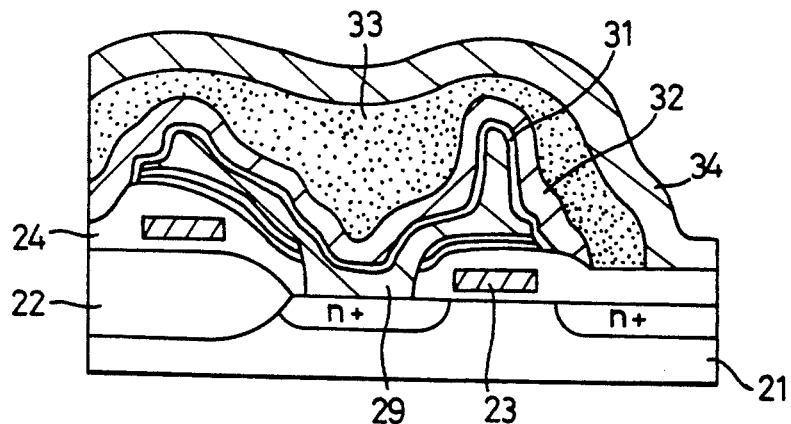

As shown in FIG. 2(F), a third polysilicon layer 32 is deposited and patterned to form a cell plate and finally, as shown in FIG. 2(G), an insulated layer 33 of BPSG is formed and etched to form contact and then the bit line 34 is formed.

A second embodiment of the present invention is described below with reference to the accompanying FIG. 3.

Figure 3A:
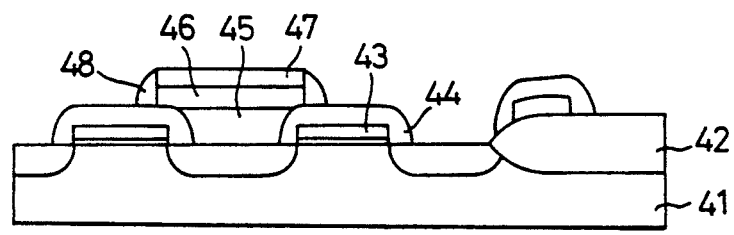
FIGS. 3(A) through 3(H) are schematic views of a fabrication process for a semiconductor memory cell according to a second embodiment of the present invention.

First, as shown in FIG. 3(A), field oxide layer 42 is grown on substrate 41 and polysilicon layer 43 is deposited and patterned to form a gate and a first silicon oxide layer 44 is deposited and patterned. A first polysilicon layer 45 is deposited and patterned, so that only a predetermined portion remains. Then, the bit line 46 and the second silicon layer 47 are formed on the whole surface and then etched to remain above only the patterned first polysilicon layer 45. Then, another silicon oxide layer is deposited and etched by using the anisotropic dry etching method to form a side wall 48.

Figure 3B:
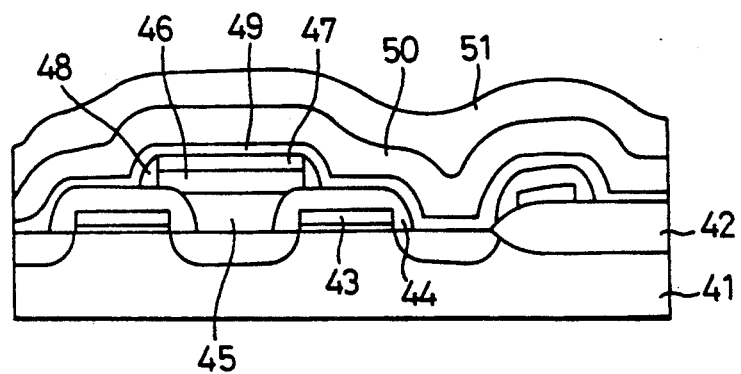

Then, as shown in FIG. 3(B), a doped second polysilicon layer 49, a third silicon oxide layer 50 and a silicon nitride layer 51 are formed on the whole surface in order.

Figure 3C:
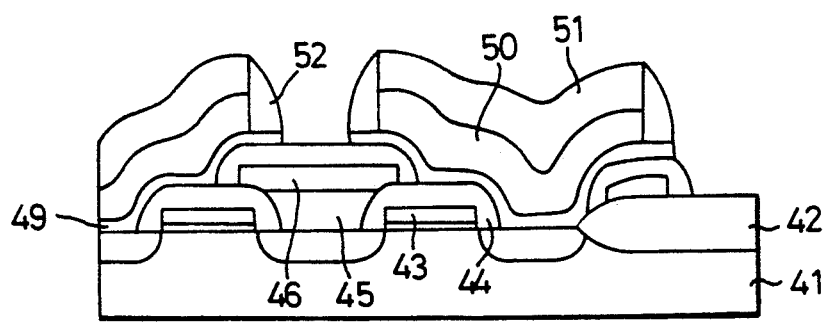

Furthermore, as shown in FIG. 3(C), the third silicon oxide layer 50 and the silicon nitride layer 51 are patterned and a doped third polysilicon layer 52 is deposited on the whole surface and etched by using an anisotropic dry etching method to form side poly walls.

Figure 3D:
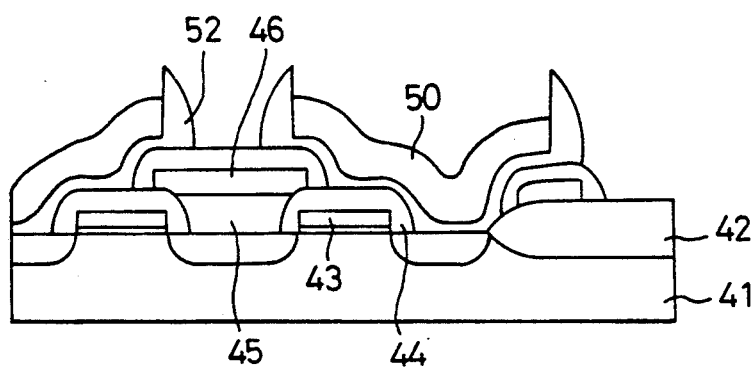
Figure 3E:
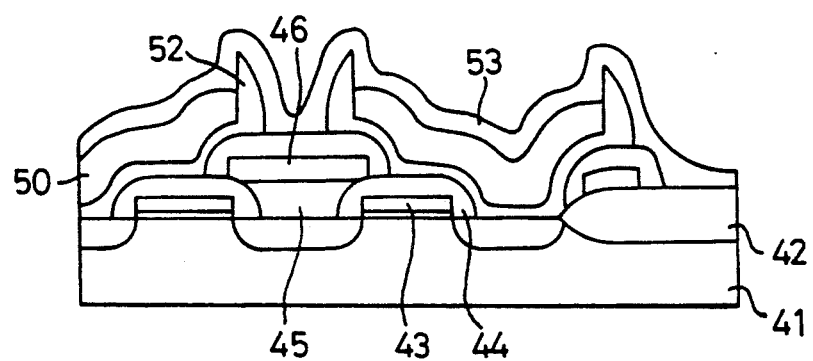
Figure 3F:
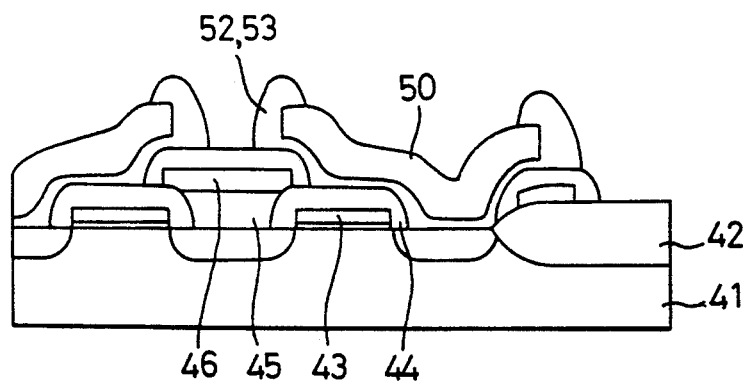

As shown in FIG. 3(D), the silicon nitride layer 51 is removed by using the wet etching method. As shown in FIG. 3(E), a doped fourth polysilicon layer 53 is deposited, and as shown in FIG. 3(F), the doped fourth polysilicon layer 53 is etched by using an anisotropic dry etching method to form the top of the polysilicon storage node in the shape of a peak.

Figure 3G:
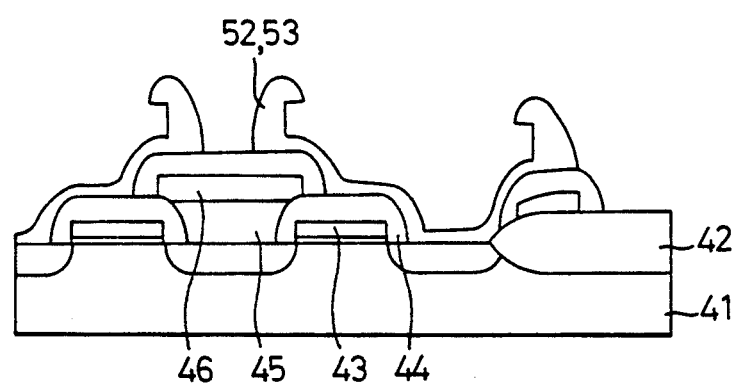
Figure 3H:
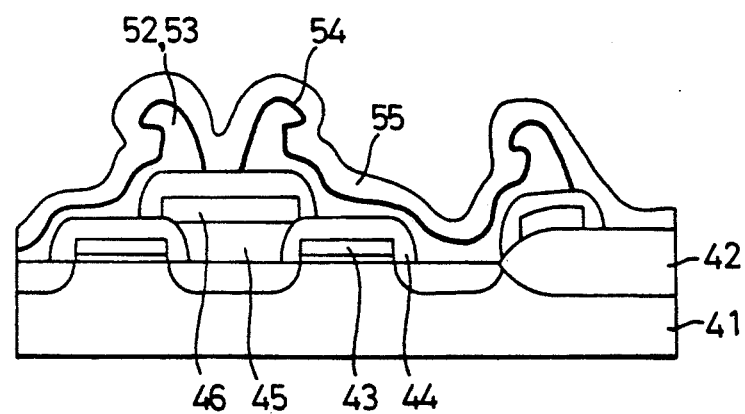

As shown in FIG. 3(G), the third silicon oxide layer 50 is removed by using a wet etching method and as shown in FIG. 3(H), a dielectric film 54 of a capacitor is formed and a fifth polysilicon layer 55 is deposited and patterned to form a cell plate. Thus, the capacitor cell of the semiconductor memory cell is fabricated.

As above mentioned, the present invention has advantages as follows: First, the overlay accuracy can be improved by patterning a polysilicon pad and a polysilicon storage node with a self-alignment method. Second, the fabrication process can be simpler than the prior fabrication process for the semiconductor memory cell of a noble stacked capacitor cell structure. Third, the storage capacitance of the capacitor can be increased.

While the invention has been particularly shown and described herein with reference to preferred and other embodiments thereof, it will be understood by those skilled in the art that various modifications and changes may be made to the instant invention, utilizing the principles of the invention as described herein, without departing from the spirit and scope thereof as encompassed in the accompanying claims to cover all such equivalent variations as come within the scope of the invention as described.

What is claimed is:

1. A method for fabricating a semiconductor memory cell consisting of a switching transistor and a capacitor patterned simultaneously with a polysilicon pad and a polysilicon storage node by a self-alignment method without a mask, comprising the successive steps of:
   (a) forming a field oxide layer and a gate on a substrate;
   (b) forming thereon a CVD silicon oxide layer and successive deposition layers of a silicon nitride pad and a silicon oxide pad layer;
   (c) patterning said silicon oxide pad layer and then patterning the said silicon nitride pad layer and said CVD silicon oxide layer successively to form a buried contact;
   (d) forming thereon and patterning a first polysilicon layer and a CVD oxide for planarization;
   (e) forming thereon, in order, a second polysilicon layer and a silicon oxide layer;
   (f) etching said silicon oxide layer by using an anisotropic dry etching method in order to form a silicon oxide sidewall and then etching said first and second polysilicon layers;
   (g) removing the silicon oxide sidewall, the CVD oxide for planarization and the silicon nitride pad layer by a wet etching method;
   (h) forming a dielectric film;
   (i) forming a third polysilicon layer and patterning to form a cell plate; and
   (j) forming an insulated layer and etching it to form a contact and a bit line.

2. A method according to claim 1, wherein a silicon nitride layer is used for an etching stopper in step (f).

3. A method according to claim 1, wherein the insulated layer in step (j) is formed of boron phosphosilicate glass.

4. A method for fabricating a semiconductor memory cell consisting of a switching transistor and a capacitor patterned simultaneously with a polysilicon pad and a polysilicon storage node by a self-alignment method without a mask, comprising the successive steps of:
   (a) forming a field oxide (42) and a gate on a substrate (41);
   (b) depositing and patterning thereon a first silicon oxide layer (44);
   (c) forming and patterning a first doped polysilicon layer (45), so that only a bit line (46) portion thereof remains;
   (d) patterning a bit line (46), and a second silicon oxide layer (47) and again forming thereon a subsequent silicon oxide layer and forming a side wall (48) by etching said subsequent silicon oxide layer;
   (e) forming thereon, in order a second polysilicon layer (49), a third silicon oxide layer (50), and a silicon nitride layer (51);
   (f) patterning said third silicon oxide layer (50) and said silicon nitride layer (51), and forming and patterning a doped third polysilicon layer (52) by an anisotropic dry etching method, so that the doped third polysilicon layer (52) remains only in a side thereof;
   (g) removing said silicon nitride layer (51) by a wet-etching method, and forming and patterning a doped fourth polysilicon layer (53) by a isotropic dry etching method to form a top of a polysilicon storage node in a shape of a peak; and
   (h) removing said third silicon oxide (50) layer by a wet etching method, and forming a dielectric film (54) and a cell plate.

* * * * *